US010481193B2

(12) United States Patent
Katz et al.

(10) Patent No.: US 10,481,193 B2
(45) Date of Patent: Nov. 19, 2019

(54) PROGRAMMABLE LOAD TRANSIENT CIRCUIT

(71) Applicant: Texas Instruments Incorporated, Dallas, TX (US)

(72) Inventors: Daniel Alexander Katz, Nashua, NH (US); Michael James Munroe, Londonderry, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 106 days.

(21) Appl. No.: 15/887,531

(22) Filed: Feb. 2, 2018

(65) Prior Publication Data

US 2019/0242937 A1 Aug. 8, 2019

(51) Int. Cl.

| | |
|---|---|
| ***G01R 31/00*** | (2006.01) |
| ***G01R 31/02*** | (2006.01) |
| ***G01R 19/165*** | (2006.01) |
| ***H03K 19/003*** | (2006.01) |
| ***G01R 31/30*** | (2006.01) |
| ***G01R 31/319*** | (2006.01) |
| ***G01R 31/28*** | (2006.01) |
| ***G01R 31/3185*** | (2006.01) |
| *H02M 1/00* | (2006.01) |

(52) U.S. Cl.

CPC ..... *G01R 31/022* (2013.01); *G01R 19/16519* (2013.01); *G01R 31/2834* (2013.01); *G01R 31/3004* (2013.01); *G01R 31/31905* (2013.01); *G01R 31/31924* (2013.01); *G01R 31/318516* (2013.01); *H03K 19/00384* (2013.01); *H02M 2001/0029* (2013.01)

(58) Field of Classification Search

None

See application file for complete search history.

(56) References Cited

U.S. PATENT DOCUMENTS

| | | | | |
|---|---|---|---|---|
| 5,160,896 | A * | 11/1992 | McCorkle | H03F 3/2171 327/31 |
| 5,594,386 | A * | 1/1997 | Dhuyvetter | H03F 3/217 330/251 |
| 6,504,395 | B1 * | 1/2003 | Johnson | G01R 31/31721 324/750.02 |
| 6,906,578 | B2 * | 6/2005 | Johnson | H03F 3/45475 327/538 |
| 9,478,984 | B2 | 10/2016 | Todi et al. | |
| 2017/0250655 | A1 * | 8/2017 | Cope | H03F 3/2173 |

* cited by examiner

*Primary Examiner* — Vinh P Nguyen

(74) *Attorney, Agent, or Firm* — Ronald O. Neerings; Charles A. Brill; Frank D. Cimino

(57) ABSTRACT

A programmable load transient circuit includes a switchable power device for coupling a DUT output to its non-control node in series with a current sense device. A feedback loop is between the current sense device and the power device's control node that includes an integrator including an amplifier coupled to receive a signal that is a function of an average load current ($I_{Davg}$) supplied by the DUT from the current sense device and to receive a reference voltage (Vref). The integrator provides an output drive voltage that is coupled to an input of a level shifter which receives a pulse signal or DC level at another of its inputs. The level shifter provides an output waveform or DC voltage to the power device's control node that is a function of $I_{Davg}$.

20 Claims, 5 Drawing Sheets

PROGRAMMABLE LOAD TRANSIENT CIRCUIT

FIELD

This Disclosure relates to programmable load transient circuits for the testing of electronic devices such as power supplies.

BACKGROUND

One important performance parameter for power supplies, for both linear and switching power supplies, is their load transient response. Load transient response measurements show the ability for a power supply to respond to abrupt changes in the current demand from a load (e.g., a microprocessor) referred to as the load current. The load transient is a load current step, which injects a disturbance into the output of the power supply.

Testing a power supply at different output voltages for a particular load current step can be a time consuming process. Using an off-the-shelf electronic load allows for easy configuration of the load step, but it is ineffective for providing relatively fast load transient responses (e.g., greater than 1 A/μs) due to the inductance of the cables connecting the power supply to the electronic load. Physically bolting the power supply to the electronic load may help to reach the maximum slew rate of the electronic load, but is impractical for most transient load testing.

Another known solution for a load transient circuit is a field effect transistor (FET) connected in series with a resistor (R). An advantage of this arrangement is that the FET and R can be placed next to a device under test (DUT) output for significantly faster slew rates. Disadvantages of this arrangement include the peak load current ($I_{peak}$) will vary based on the DUT's output voltage (Vout) for a given R value, and to obtain a different fixed $I_{peak}$ across Vout, the R value needs to be changed. As a result, this arrangement slows down validation test execution of a DUT.

As the power density of switching power supplies increases and their footprint decreases, the switching frequencies used also generally increases. Validating the operation of a variety of a newly designed electronic device (e.g., a silicon-based switching power supply) for potential end customer applications can benefit from faster transient response testing, both in the slew rate and the pulse repetition frequency.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure describes programmable load transient circuits that utilize the average load current ($I_{Davg}$) from the DUT for load control. To test a DUT across multiple output voltages, a switchable power device such as a FET is configured in a feedback loop that utilizes the power device as a voltage controlled current source, where the voltage amplitude of the pulse signal or a DC voltage applied to the control node of the power device is adjustable. When the pulse signal or a DC voltage is adjusted, it changes the power device's operating current which is supplied by the DUT (and is thus the DUT's $I_D$).

Disclosed aspects comprise programmable load transient circuits that include a switchable power device for coupling a DUT output to its non-control node in series with a current sense device. A feedback loop is between the current sense device and the power device's control node that includes an integrator including an amplifier that is coupled to receive a signal that is a function of $I_{Davg}$ supplied by the DUT from the current sense device and to receive a reference voltage. The integrator provides an output drive voltage that is coupled to an input of a level shifter which receives a pulse signal or DC level at another of its inputs. The level shifter provides an output waveform or DC voltage to the power device's control node that is a function of the $I_{Davg}$.

BRIEF DESCRIPTION OF THE DRAWINGS

Reference will now be made to the accompanying drawings, which are not necessarily drawn to scale, wherein.

DETAILED DESCRIPTION

Figure 1A:
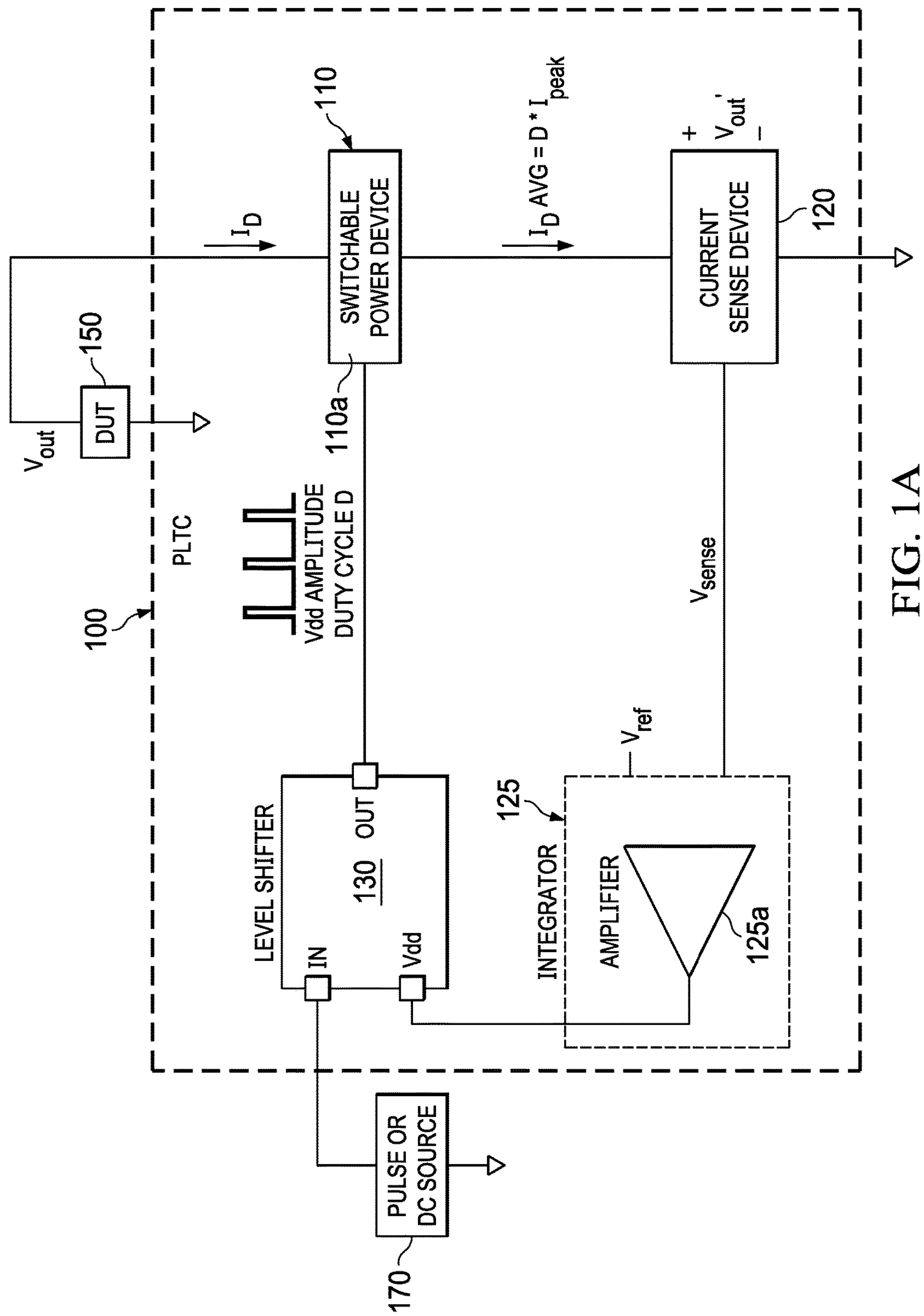
FIG. 1A shows an example programmable load transient circuit (PLTC) including a feedback loop that utilizes the power device as a voltage controlled current source that is configured to test a DUT, according to an example aspect.

Example aspects in this disclosure are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A shows an example PLTC 100 connected to test the load transient response of a DUT 150, according to an example aspect. The DUT 150 can comprise generally any DUT type including DUTs having relatively demanding load transient requirements, such as low-dropout (LDO) regulators, DC-DC regulators, power management ICs (PMICs) or operational amplifiers (op-amps). PLTC 100 accomplishes load transient testing the DUT 150 across multiple Vouts by using a switchable power device 110 configured as a voltage controlled current source that is in series with the DUT 150, where the voltage amplitude of the pulse signal or DC voltage applied to the control node 110$a$ of the switchable power device 110 is adjustable based on $I_{Davg}$.

The PLTC 100 in FIG. 1A accomplishes this without sacrificing bandwidth of the PLTC 100 using a level shifter 130, and controlling the supply voltage Vdd applied to the level shifter 130 to be a function of $I_{Davg}$ which is sensed by a current sense device 120. The current sense device 120 can comprise a R (see Rsense 115 in FIG. 1B described below). For example, the current sense device 120 can comprise an R realized as a metal trace on a printed circuit board (PCB), a wire segment, generally any current measurement element, or a current measurement circuit or current measurement device such as a Hall Effect sensor.

The switchable power device 110 can comprise a power FET, a power bipolar device, a junction field-effect transistor (JFET), an Insulated Gate Bipolar Transistor (IGBT), or other voltage controlled current source. The switchable power device 110 is adapted to couple to an output of the DUT 150 that is shown providing Vout to a non-control node of the switchable power device 110 (the non-control node is shown as the drain of an N-channel metal oxide semiconductor (MOS) FET 110' in FIG. 1B described below). The switchable power device 110 is in series with the current sense device 120 that has its other end connected to ground.

The PLTC 100 is configured as a feedback loop between the current sense device 120 and the control node 110$a$ of the switchable power device 110. The feedback loop comprises an integrator 125 including an amplifier 125$a$, such as an op-amp, that can be a buffer (a unity gain amplifier) or a digital accumulator, and a level shifter 130. The amplifier 125$a$ is also adapted to receive a reference voltage (Vref) at one of its inputs, such as a reference voltage level, digital-to-analog converter (DAC) output, or another dynamically changing voltage, such as coupled to the non-inverting (+) input of the op am 125$a'$ in FIG. 1B As described below, for PLTC 100 the Vref value applied to an input of the amplifier 125$a$ sets the $I_{peak}$ value for the DUT 150, so that the value(s) of Vref utilized during testing are based on the user desired $I_{peak}$ value(s) for testing the DUT 150.

An output of the amplifier 125$a$ is coupled to a first input (shown as a Vdd (power supply input) of a level shifter 130 that is adapted to also receive a pulse signal or a DC level at its second input from the pulse signal or DC source 170 shown in FIG. 1A. The level shifting function performed by the level shifter 130 can maintain the pulse signal shape and its D received from the pulse signal or DC source 170, but changes its amplitude to that of Vdd as shown in FIG. 1A on its output (Out) pin. There are many commercially available level shifters, or custom designed level shifters that comprise discrete components. The specific level shifting topology utilized herein generally does not matter, provided the signal from the pulse or DC source 170 is translated to the Vdd voltage level.

Due to the action of the feedback loop which senses Vout' across the current sense device 120 and changes the Vdd supplied to the level shifter 130 as a function of the $I_{Davg}$ shown in FIG. 1A provided by the DUT 150, the level shifter 130 provides an output waveform to the control node 110$a$ of the switchable power device 110 (with a sample waveform shown) having an amplitude that is a function of $I_{Davg}$. As described above, changing $I_D$ changes the Vout' across the current sense device 120, and the switchable power device 110 isolates Vout' across the current sense device 120 from Vout (provided by the DUT 150), which enables testing the DUT 150 across multiple output voltages.

Figure 1B:
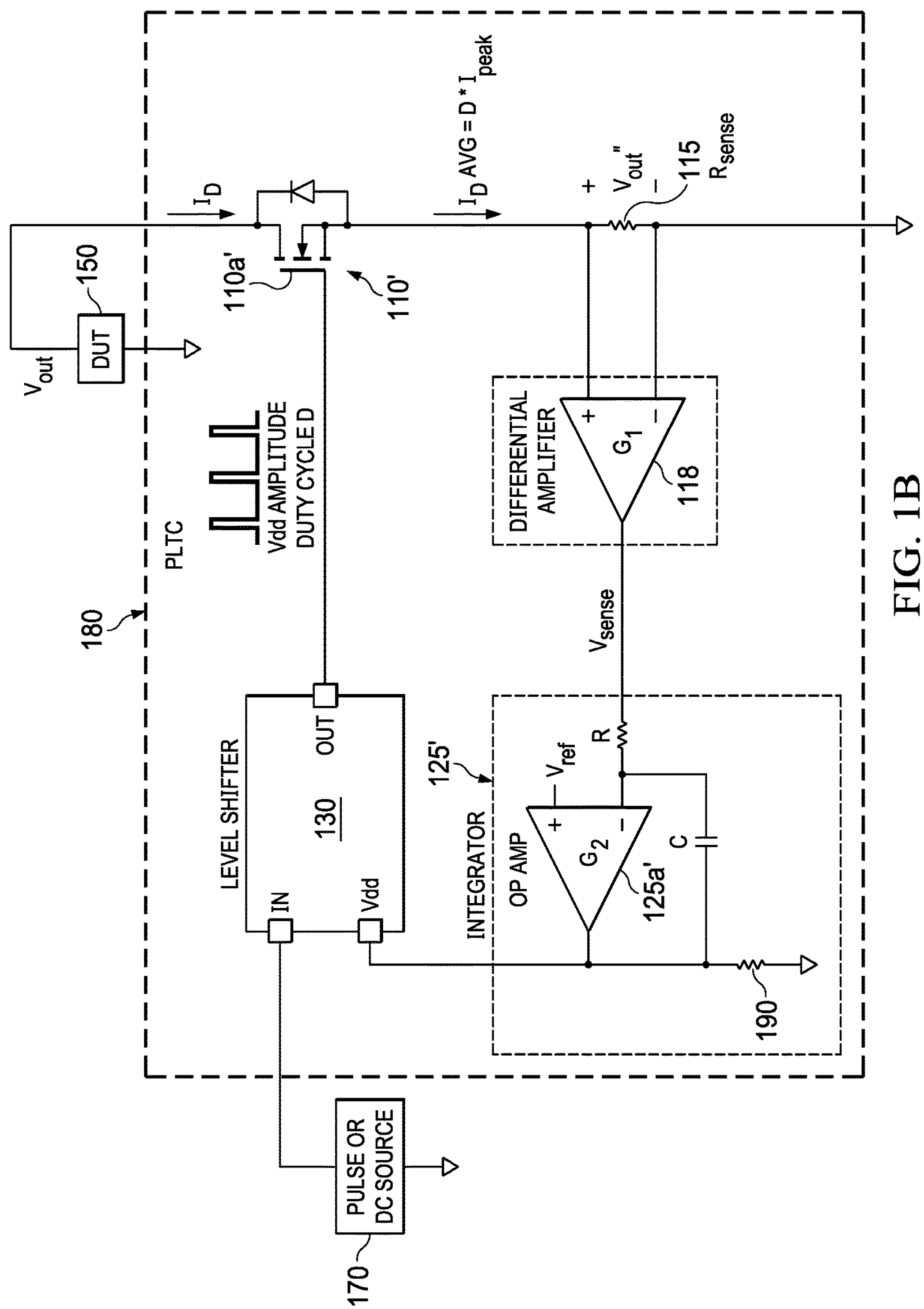
FIG. 1B shows another example PLTC including a feedback loop that utilizes a power transistor as a voltage controlled current source that is configured to test a DUT, according to an example aspect.

FIG. 1B shows another PLTC 180 connected to test the load transient response of a DUT 150, according to an example aspect. Here the switchable power device 110 is shown as a power MOS device 110', such as a Laterally Diffused Metal Oxide Semiconductor (LDMOS) device. The current sense device 120 in FIG. 1A is shown in FIG. 1B as a sense R (Rsense) 115 which coupled to drive a differential amplifier 118 shown as G1 (having a gain G1), where the differential amplifier 118 is connected across Rsense 115. The value of Rsense 115 can be dependent on the Vout range for the DUT 150 to be supported, accuracy requirements, and the Id range to be supported. Rsense 115 can be an external component or an integrated on-chip resistor.

The differential amplifier 118 is shown coupled to a first input of an op amp 125$a$ shown as G2, where the op amp 125$a'$ is configured as an integrator with an input resistor R and a feedback capacitor C. The values of R and C are generally selected to meet the settling time and overshoot requirements of the intended test application. The output of the differential amplifier 118 is coupled to the inverting input of the op amp 125$a'$ which has its output shown coupled to the Vdd input of the level shifter 130. There is also shown a high impedance pulldown resistor 190 to ground from the output of the op amp 125$a'$ which helps the PLTC 180 to power up from a known state.

The speed at which Vdd output by the op amp 125$a'$ at its output changes depends on the RC time constant of the integrator 125'. A typical time constant range is 1 ms to 10 ms. However, the time constant can be faster or slower than this range. The RC time constant range selected is selected to generally work with the typical evaluation times in circuit validation. The RC of the integrator 125' functions as the dominant pole in the feedback loop of the PLTC 180 in order to maintain loop stability. The RC time constant generally does not need to be fast because it only affects the settling time of the transition of the amplitude of Vdd, and thereby the load current $I_D$. When AC testing the DUT 150, the frequency of the pulse signal from the pulse signal or DC source 170 determines the frequency of the $I_D$ step.

Figure 2:
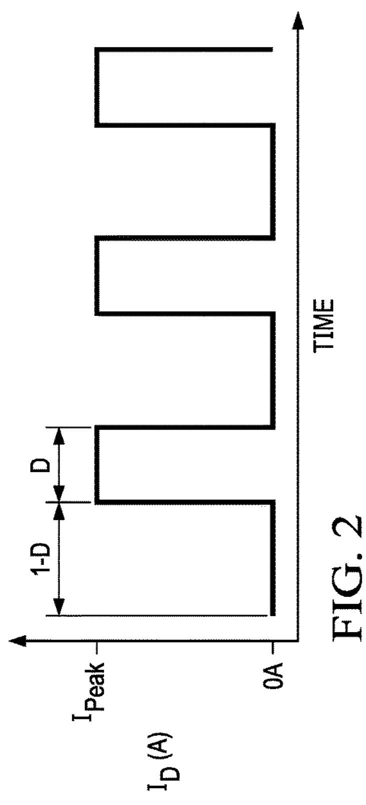
FIG. 2 is a plot of $I_D$ shown as pulses generated by the PLTC shown in FIG. 1A or FIG. 1B as a function of time showing its $I_{peak}$ and duty cycle (D).

FIG. 2 is a plot of the $I_D$ shown as pulses generated by the PLTC 180 shown in FIG. 1B, showing both $I_{peak}$ and D as a function of time. As known in the art the product of pulse width (pw) and pulse-repetition frequency (prf) is the D.

Regarding the steady state relationships for the PLTC 180:

$$I_{peak}=Vref/(Rsense\ 115*G1\text{ of differential amplifier }118*D)$$

IPeak is thus Vout independent, and as Rsense 115 and G1 are fixed, D can be fixed by the pulse signal or DC source 170, such as a pulse generator, so that $I_{Peak}$ is only dependent on the value of Vref.

Regarding transient operation of PLTC 180 (and similarly the operation for PLTC 100 shown in FIG. 1A), when Vref is changed, the integrator 125 including its op amp 125$a'$ with its RC shown in FIG. 1B adjusts its output shown as Vdd until the sensed voltage shown as Vout" in FIG. 1B equals the Vref value again. The adjustment time is based on the RC time constant of the integrator 125'.

for the differential amplifier 118:

$V_{sense}=G_1*R_{sense}*I_{AVG}$ $V_{sense}=G_1*R_{sense}*I_{Peak}*D$ (using $D*I_{peak}=I_{AvG}$)

for the integrator 125 including op amp 125$a'$ and the RC network, regarding Vsense (Vsense is Vout' shown in FIG. 1A and Vout" shown in FIG. 1B):

$V_{sense}=V_{ref}$ at steady state

Through substitution, the following expression for $I_{peak}$ is obtained, where $I_{peak}$=Vref/(Rsense*G1*D).

Thus $I_{peak}$ can be set by Vref or by D. Both the Vref signal and the pulse signal frequency (thus the D) provided from the pulse signal or DC source 170 can be generally easily controlled to meet the requirements of the application being evaluated, through bench equipment automation, allowing for a programmable load transient generator. Disclosed PLTC's such as PLTC 100 (in FIG. 1A) and PLTC 180 (in FIG. 1B) allow for a configurable $I_{peak}$ that is independent of the DUT's 150 Vout. In contrast, as described above, conventional transient load circuits used in power supply testing has an $I_{peak}$ that is dependent on the DUT's Vout.

Moreover, conventional programmable load transient circuit solutions to test load transient responses of DUTs, such as point of load power supplies, do not work effectively for extensive automated testing for multiple output voltages and load steps at fast slew rates. Disclosed PLTCs and related circuits in contrast significantly reduce the execution time of circuit validation (testing of the first silicon for new DUTs) by not requiring physical replacement of any load transient circuit component (typically R's) while maintaining sufficiently fast slew rates.

Disclosed methods of pulsing the $I_{peak}$ for a DUT implemented by a disclosed PLTC such as the PLTC 180 shown in FIG. 1B utilizes two control loops. The first control loop is a relatively slow and accurate $I_{Davg}$ controlled loop that regulates the current of the pulse. The second control loop is a relatively fast uncompensated open loop switching of the load. This allows for fast transition times of $I_D$ that do not rely on the closed loop response of any amplifier.

EXAMPLES

Disclosed embodiments are further illustrated by the following specific Examples, which should not be construed as limiting the scope or content of this Disclosure in any way.

A prototype PLTC resembling the PLTC 180 shown in FIG. 1B was implemented on a PCB. The power MOS device 110' comprised an LDMOS device, and Rsense 115 comprised a chip resistor that was sized for the desired current handling capabilities and power dissipation requirements. The pulse signal or DC source 170 comprised a pulse generator. The R and C for the integrator 125' were chosen to be 1 MΩ and 0.01 μF, respectively. The level shifter 130 comprised a SN74LV1T126 level shifter, which is a single power supply quadruple buffer translator gate with 3-state output complementary metal-oxide-semiconductor (CMOS) logic level shifter from Texas Instruments Incorporated, with a turn on voltage less than the threshold voltage of the power MOS device 110'. Using a level shifter with a turn on voltage less than the threshold voltage of the power MOS device 110' allows for the level shifter 130 to operate in the cutoff region of the power MOS device 110', and also allows current steps from the full rating of the current handling down to no current. A Rogowski coil was used to measure the AC current. The AC current in this case was the load step. The DUT tested was a benchtop power supply connected to capacitors connected in parallel with the output voltage. These capacitors simulate the output capacitors of an onboard power supply such as a Low Drop Out (LDO) regulator, switching DC-DC regulator, or a PMIC.

Figure 3A:
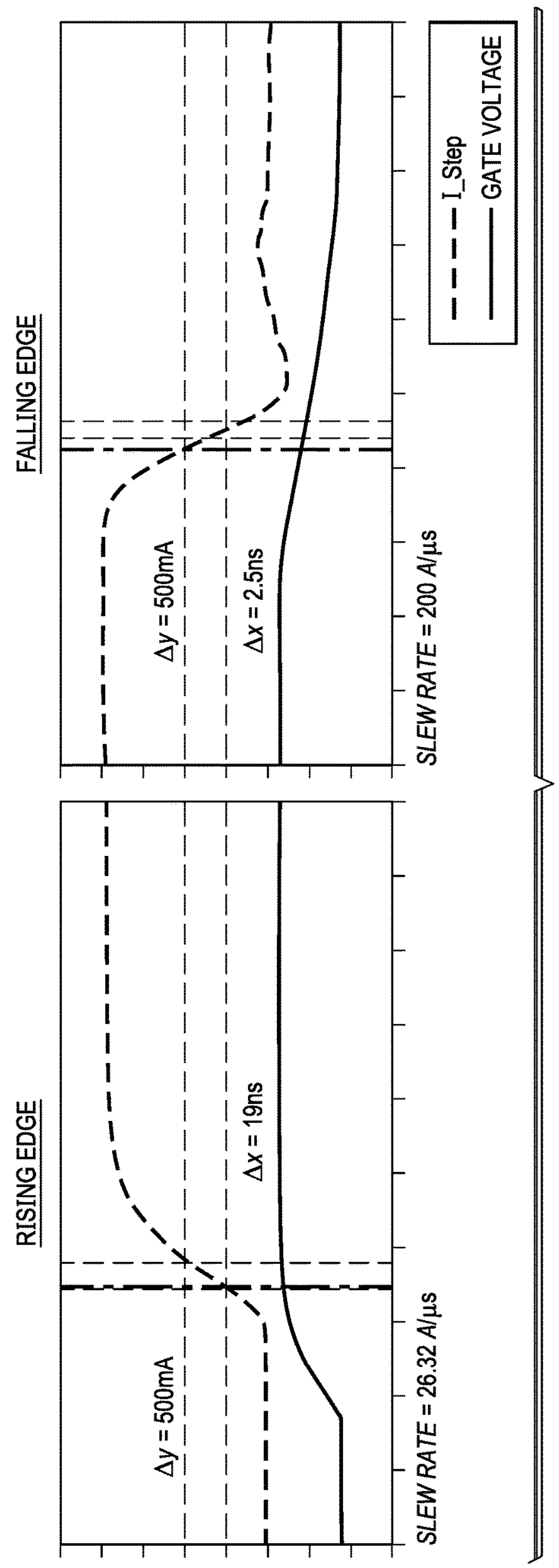
FIGS. 3A-C show repetition rate performance for a disclosed PLTC showing the rising edge and the falling edge for the load current step (shown as I-Step) at a 5, 50, and 500 kHz repetition rate, respectively.
Figure 3B:
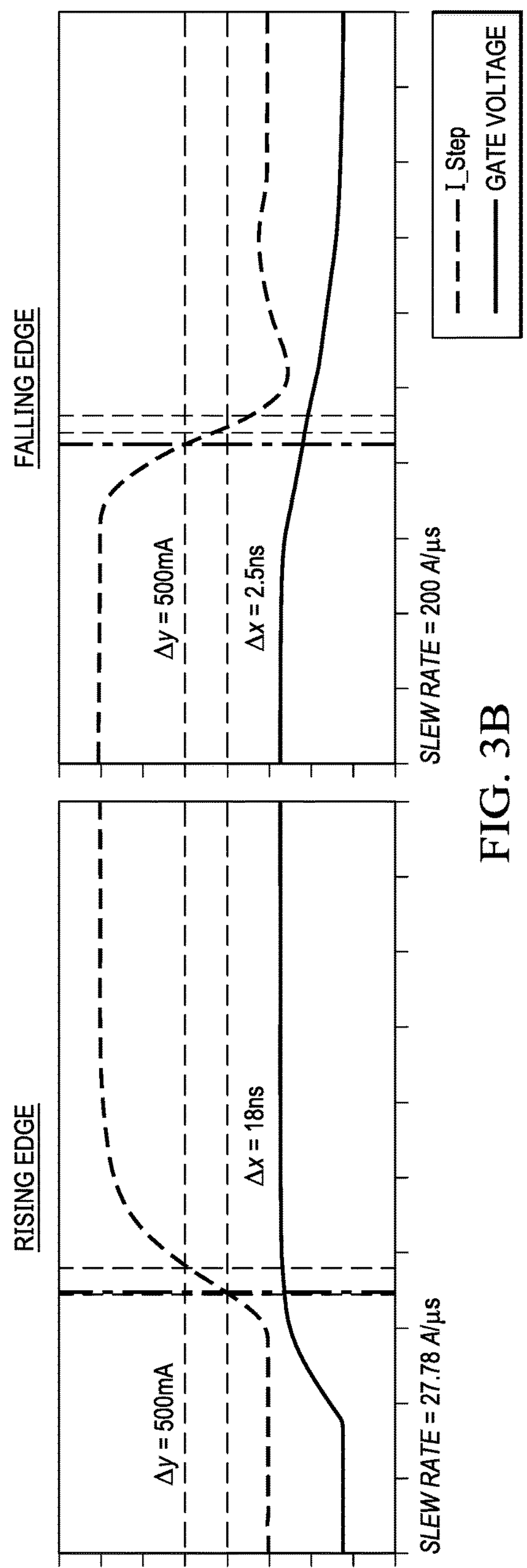
Figure 3C:
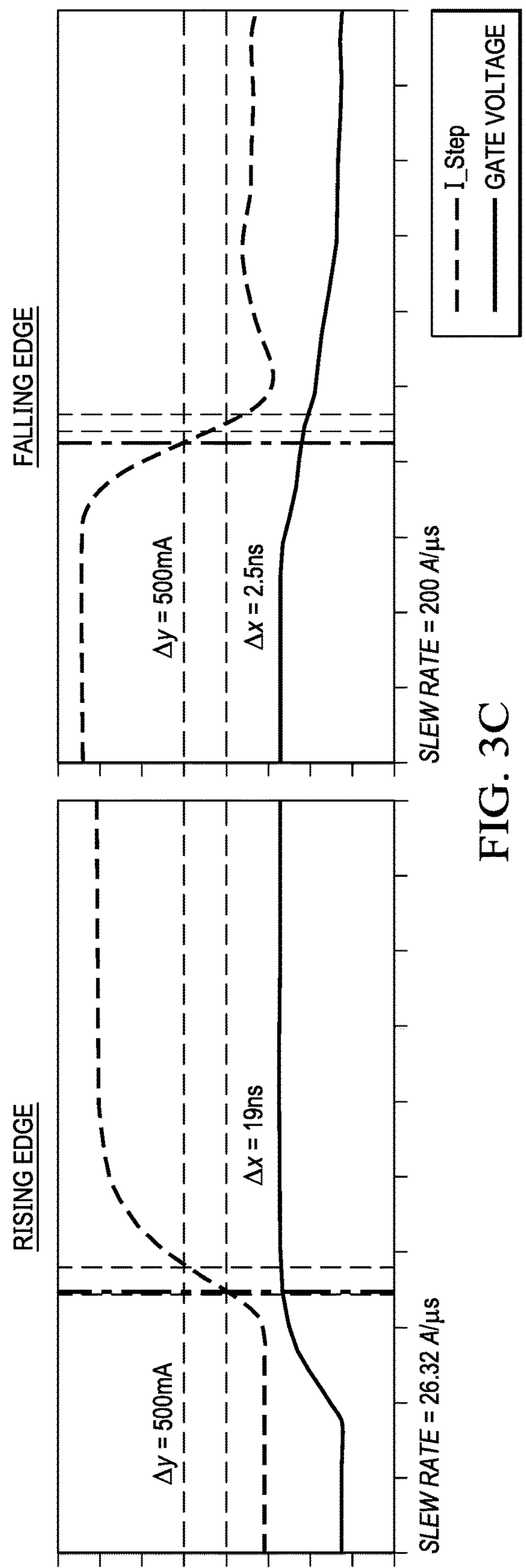

Fast slew rates were observed across a wide repetition rate frequency range. FIG. 3A shows the 5 kHz repetition rate performance showing the rising edge and the falling edge for the load current step (I-Step). The slew rate for the rising edge was 26.32 A/μs, and slew rate for the falling edge was 200 A/μs. These particular edge rate results are due to the drive strength of the level shifter circuit chosen. FIG. 3B shows the 50 kHz repetition rate performance showing the rising edge and the falling edge for the load current step (I-Step). The slew rate for the rising edge was 27.78 A/μs, and slew rate for the falling edge was 200 A/μs. FIG. 3C shows the 500 kHz repetition rate performance showing the rising edge and the falling edge for the I-Step. The slew rate for the rising edge was 26.32 A/μs, and slew rate for the falling edge was 200 A/μs. For comparison, for a conventional electronic load comprising a FET and a resistor in series, the maximum slew rate is about 2.5 A/μs, and cabling between the pulse generator and the gate of the FET significantly diminishes this slew rate.

Those skilled in the art to which this Disclosure relates will appreciate that many other variations are possible within the scope of the claimed invention, and further additions, deletions, substitutions and modifications may be made to the described aspects without departing from the scope of this Disclosure.

The invention claimed is:

1. A programmable load transient circuit (PLTC), comprising:

a switchable power device providing a voltage controlled current source adapted to couple to an output of a device under test (DUT) to a non-control node of said switchable power device, said switchable power device in series with a current sense device that is connected to ground;

a feedback loop between said current sense device and a control node of said switchable power device, said feedback loop including:

an integrator comprising an amplifier coupled to receive a signal that is a function of an average load current ($I_{Davg}$) supplied by said DUT from said current sense device, said amplifier adapted to receive a reference voltage (Vref) and to provide an output drive voltage, wherein an output of said amplifier is coupled to a first input of a level shifter to provide said output drive voltage, wherein said level shifter is adapted to also receive a pulse signal or DC level from a pulse signal or DC source at its second input, said level shifter providing an output waveform or a DC voltage to said control node of said switchable power device that is a function of said $I_{Davg}$.

2. The PLTC of claim 1, wherein said current sense device comprises a differential amplifier connected across a sense resistor, and wherein said amplifier comprises an operational amplifier having an RC network comprising an input resistor R and a feedback capacitor C.

3. The PLTC of claim 2, wherein said PLTC during transient testing is configured to have said integrator adjust said output drive voltage until a voltage across said current sense device equals said Vref.

4. The PLTC of claim 3, wherein an adjustment time during said transient testing is based on a time constant of said RC network.

5. The PLTC of claim 2, wherein said sense resistor comprises an integrated on-chip resistor.

6. The PLTC of claim 1, wherein said switchable power device comprises a metal oxide semiconductor (MOS) transistor.

7. The PLTC of claim 1, wherein said PLTC has no dependence of said load current on an output voltage at said output of said DUT.

8. The PLTC of claim 1, wherein said PLTC is adapted to be receive its programmability for said load current by changing said Vref or by said pulse signal or DC source changing its pulse signal frequency to change its duty cycle.

9. The PLTC of claim 1, wherein said amplifier is configured as a unity gain amplifier.

10. A method of automated load transient response testing of a device under test (DUT), comprising:

testing said DUT utilizing a programmable load transient circuit (PLTC) across multiple output voltages without changing any hardware, comprising:

configuring a switchable power device in a feedback loop that utilizes said switchable power device as a voltage controlled current source that is in series with a current sense device, where a voltage amplitude of a pulse signal applied to a control node of said switchable power device is adjustable and changes said switchable power device's operating current which is supplied as load current ($I_D$) by said DUT;

setting a voltage reference (Vref) input in said feedback loop to a first Vref value and then testing said DUT at a first output voltage, and setting said Vref input to a second Vref value and then retesting said DUT at a second output voltage.

11. The method of claim 10, wherein said PLTC has no dependence of said $I_D$ on said output voltage of said DUT.

12. The method of claim 10, wherein said feedback loop comprises an integrator including an amplifier coupled to receive a signal that is a function of an average of said $I_D$ from said current sense device, and wherein an output of said amplifier is coupled to a first input of a level shifter that is adapted to also receive a pulse signal or DC level from a pulse signal or DC source at its second input.

13. The method of claim 12, wherein said pulse signal or DC source comprises a pulse generator.

14. The method of claim 10, wherein a frequency of said pulse signal determines a frequency of a current load step provided to said DUT.

15. The method of claim 10, wherein said current sense device comprises a differential amplifier connected across a sense resistor, and wherein said amplifier comprises an operational amplifier configured as an integrator having an RC network comprising an input resistor R and a feedback capacitor C.

16. The method of claim 15, wherein said PLTC during transient testing comprises said integrator adjusting said output drive voltage until a voltage across said current sense device equals a present level of said Vref input.

17. The method of claim 16, wherein an adjustment time during said transient testing is based on a time constant of said RC network.

18. The method of claim 10, wherein said switchable power device comprises a metal oxide semiconductor (MOS) transistor.

19. The method of claim 10, wherein said PLTC has no dependence of said load current on an output voltage of said DUT.

20. The method of claim 10, further comprising programming said PLTC for said $I_D$ by changing a level of said Vref input or by said pulse signal or DC source changing its pulse signal frequency to change its duty cycle.

* * * * *